United States Patent

Sherrill, Jr.

[15] 3,675,299

[45] July 11, 1972

[54] ARTICLE MOUNTING APPARATUS

[72] Inventor: Henry H. Sherrill, Jr., Winston-Salem, N.C.

[73] Assignee: Western Electric Company, Incorporated, New York, N.Y.

[22] Filed: May 19, 1969

[21] Appl. No.: 825,893

[52] U.S. Cl. ....................29/203 B, 269/43, 317/101 DH, 339/176 MP

[51] Int. Cl. ....................H02b 1/04

[58] Field of Search ....................29/203 B; 317/101 DH; 339/176 MP; 269/43; 225/47

[56] References Cited

UNITED STATES PATENTS 1,852,196 4/1932 Turner ....................269/43
2,263,005 11/1941 McClure ....................269/43
2,381,229 8/1945 Shalhoub ....................225/47
3,258,649 6/1966 Arguin et al. ....................317/101 DH
3,377,515 4/1968 Erb ....................317/101 DH
3,382,476 5/1968 Novet ....................317/101 DH
3,476,982 11/1969 Bell et al. ....................317/101 DH

*Primary Examiner*—William S. Lawson
*Attorney*—H. J. Winegar, R. P. Miller and S. Gundersen

[57] ABSTRACT

Articles, such as printed wiring boards, are retained between facing pairs of article retainers mounted on elongated guide tracks. The article retainers are made of a flexible material and have central portions of maximum thickness. Each article retainer is supported only at its thickest central portion by a single guide track. The article retainers locate the articles at desired spacings along the guide tracks. Pivotal flexing displacement of the article retainers permits non-uniform angular orientation of the retained articles, e.g., to compensate for misalignment between wiring board conductive paths and fixed connector assemblies.

8 Claims, 3 Drawing Figures

INVENTOR
H. H. SHERRILL, JR.

By [signature]
ATTORNEY

ARTICLE MOUNTING APPARATUS

GOVERNMENT CONTRACT

The invention herein claimed was made in the course of or under contract with the United States Army.

BACKGROUND OF THE INVENTION

This invention relates to apparatus for mounting articles and, more particularly, to apparatus for mounting articles at predetermined spacings between like portions of the articles while permitting variable angular orientations of the articles.

In the art of mounting articles, e.g., substantially flat printed wiring boards, in spaced arrays, it is known to provide mechanisms for mounting several boards in fixed, parallel positions at a selected spacing between adjacent boards. Thus, slotted guides have been utilized to receive the edges of wiring boards in the guide slots. Such slotted guides have heretofore been fixed at at least two preset, spaced locations to guide-mounting structures such that neither linear nor pivotal movement of the guides may occur. Printed wiring boards are slid into parallel positions within the guide slots in order to provide electrical coupling between conductive paths on the boards and connectors positioned in fixed locations spaced from the guide slots. So long as the fixed connectors and the conductive paths on the inserted boards are aligned correctly, the sliding insertion will provide suitable electrical connection. However, such prior art structural arrangements often do not compensate for misalignment between the conductive paths and the connectors. A relatively simple, easily assemblable, reliable mechanism for mounting printed wiring boards at fixed spacings, which mechanism allows at least some relative pivotal movement of the boards into non-parallel relationship to compensate for misalignment between the conductive paths on a board and a fixed connector member, is obviously desirable.

SUMMARY OF THE INVENTION

An object of the invention resides in new and improved apparatus for mounting articles, e.g., printed wiring boards.

The invention contemplates the use of two parallel elongated members each supporting a plurality of flexible article retainers. Each article retainer includes an article edge retaining portion facing an article edge retaining portion of another article retainer on the other elongated member. Thus, opposite edges of an article may be retained by two article retainers, one carried by each elongated member. The flexible article retainers are mounted at fixed spacings on the respective elongated members for pivotal flexing movement with respect to the elongated members. Each article retainer is supported only at a single position of engagement with an elongated member. Such mounting arrangement allows non-uniform angular orientation as between the retained articles upon flexing of the flexible article retainers about the single position of engagement. Thus, a pivotal or angular flexing of a facing pair of article retainers may be relied upon to compensate for any angular misalignment between conductive paths on a retained article and a fixed connector which must engage the conductive paths.

The article retainers are shaped, e.g., hexagonally, so as to have thickest portions. The article retainers are mounted with the elongated members intersecting each article retainer at its thickest portion in the direction of thickness of the thickest portion. Contact between the thickest portions of adjacent article retainers positions the retained articles at desired fixed spacings along the elongated members in one embodiment of the invention. In another embodiment, spacer members are positioned between adjacent article retainers to provide the desired fixed spacings between retained articles. Either embodiment may be quickly and easily assembled to provide a reliable, simple-to-use structure for mounting printed wiring boards or other articles with the desired fixed spacings between retained articles while permitting non-uniform angular orientations of the retained articles, for example, to compensate for misalignment conditions of electrical connector assemblies.

DETAILED DESCRIPTION

Figure 1:
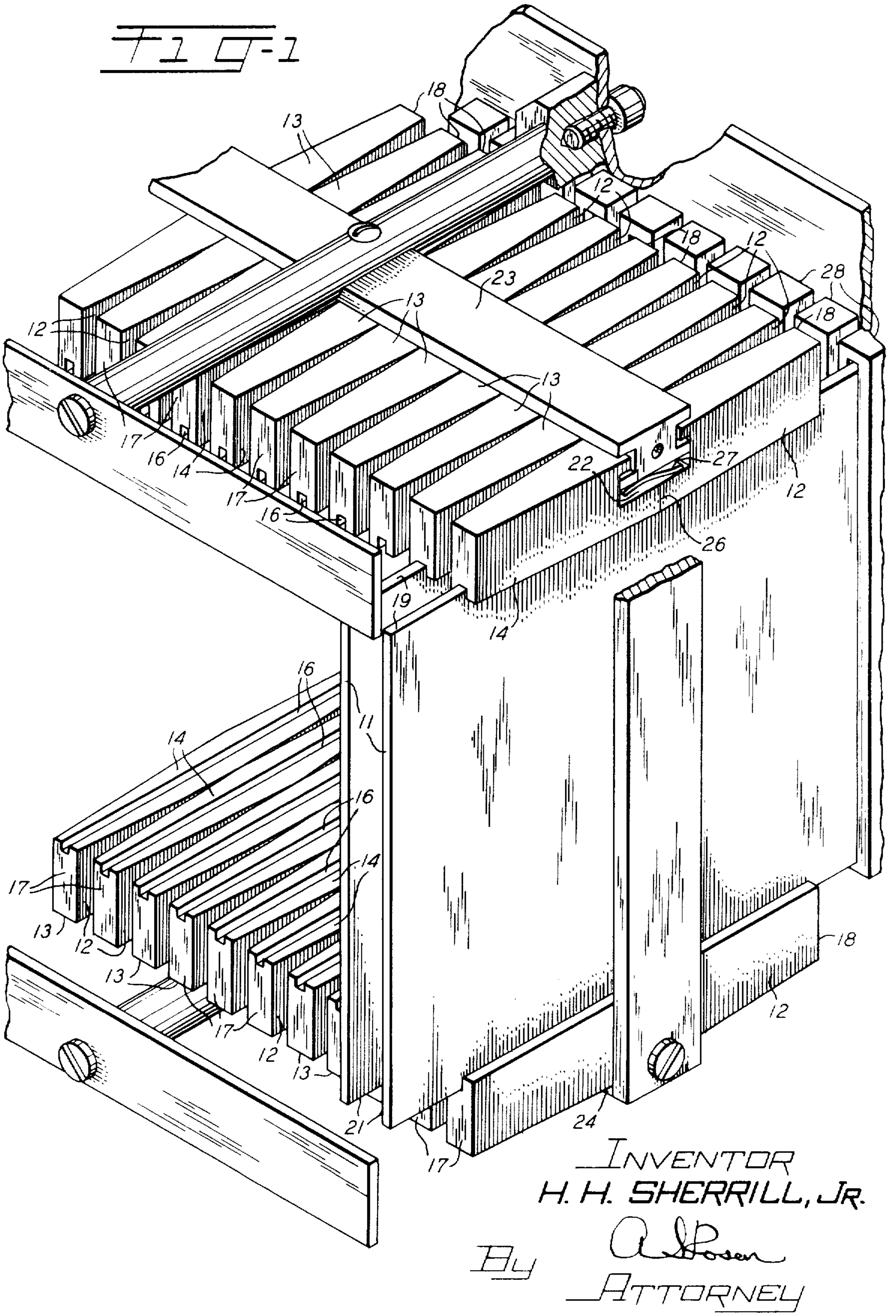
FIG. 1 is an isometric illustration, with parts broken away, of a portion of a first embodiment of apparatus constructed in accordance with the principles of the invention for mounting articles, such as printed wiring boards, the apparatus including a number of facing pairs of article retainer members for retaining opposite edges of an article.

Referring first to FIG. 1 of the drawing, there is shown a portion of apparatus constructed in accordance with the principles of the invention for mounting printed wiring boards 11 or other articles. The apparatus includes a number of article retainer members 12 composed of a flexible material, such as molded plastic. Each article retainer 12 has a pair of opposite faces 13 and 14 which are of a generally hexagonally shape. A slot 16 extends along a major dimension of the face 14 between opposite ends 17 and 18 of each article retainer 12. The slot 16 is of suitable dimensions to retain therein an edge 19 or 21 of a board 11.

Each of the article retainers 12 has a central cut out portion 22 shaped to mount the article retainer for sliding movement along mating surfaces on one or the other of two elongated support members or guide tracks 23 and 24. The cut out portions 22 are so located that the elongated guide tracks 23 and 24 intersect the article retainers 12 perpendicularly to the direction of the slots 16 along a central thickest portion 26 of each article retainer and extend along the direction of thickness of the thickest portions 26. The article retainers 12 are mounted with each engaging and being supported by only a single elongated guide track member 23 or 24 and not engaging and being supported by any other support member. The mounting arrangement is such that each flexible article retainer 12 is free to flex pivotally about a position of supporting engagement of the article retainer with the associated guide track. Spring members 27 are positioned in each of the cut out portions 22 so as to bias each article retainer 12 to urge the slotted face 14 of the article retainer into retaining engagement with the associated edge 19 or 21 of an article 11. The springs 27 apply compression to the retained articles to prevent vibration and to retain the articles firmly. The articles 11 are retained between facing pairs of article retainers 12 with a limited degree of freedom of pivotal movement. Pivotal movement of an article may occur through angular flexing of the associated article retainers 12 about the positions of supporting engagement between the slotted out portions of the article retainers and the elongated guide track members 23 and 24. Certain of the article retainers 12, e.g., alternate ones, preferably have somewhat flattened central thickest portions 26. This provides more accurate spacing between adjacent articles than would occur with perfectly hexagonal retainers in an approximate apex-to-apex array.

The mounting of each article retainer 12 with its thickest portion 26 located at the position of supporting engagement of the article retainer with the supporting guide track 23 or 24 serves two purposes. Firstly, since the article retainers 12 do not engage each other except at the thickest portions 26 along the elongated guide tracks 23 and 24, there is no contact between adjacent article retainers in locations which might interfere with the desired freedom of pivotal or angular flexing of the article retainers. Secondly, the thicknesses of the thickest portions 26 may be selected so as to position the retained articles 11 at desired fixed spacings between articles along the guide tracks. Thus, the mounting arrangement of FIG. 1 will permit non-uniform angular orientations of retained articles 11 while still providing the desired, fixed spacings between adjacent articles at the pivotal positions of the article retainers 12 along the elongated guide track members 23 and 24.

It should be noted that the arrangement of the apparatus permits quick and easy assembly of article retainers 12, having thickest portions 26 of selected thickness for appropriately spacing the articles, onto the guide tracks 23 and 24. Each successive article retainer is merely slid onto a guide track and into contact with an adjacent article retainer on the guide track. With the apparatus so assembled, it is a simple matter to insert the various articles or printed wiring boards 11 between facing article retainers 12 and into facing slots 16 from an insertion position, e.g., adjacent to the ends 17 of the article retainers. The boards 11 are slid along the slots to engage conductive paths (not shown) on leading edges of the boards with connectors 28 mounted in fixed positions adjacent to the opposite ends 18 of the article retainers 12. Flexure of the article retainers compensates for any misalignment condition, permitting the required engagement to occur.

Figures 2, 3:
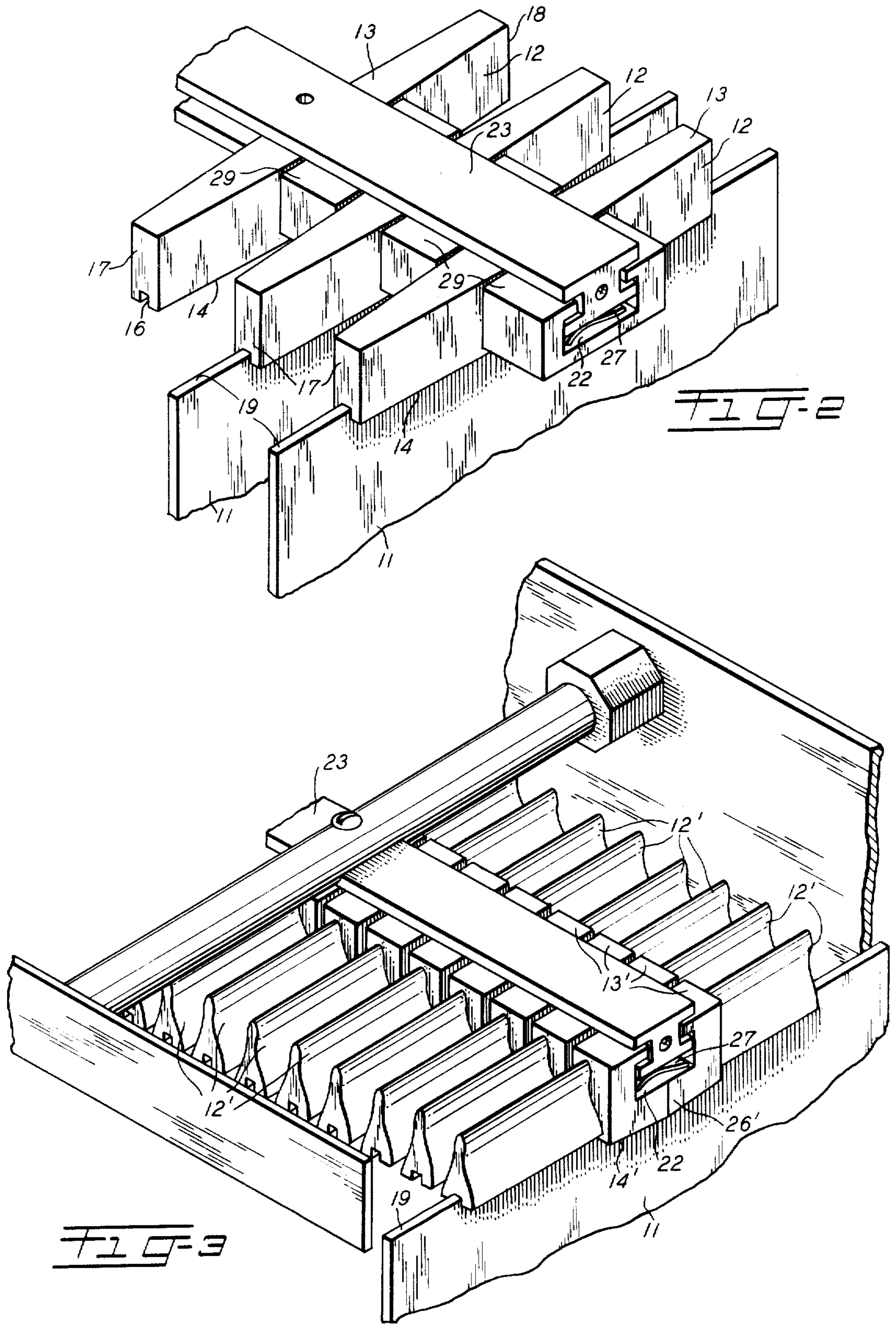
FIG. 2 is an isometric illustration, with parts broken away, of a portion of a second embodiment of the apparatus, the second embodiment incorporating spacer members between adjacent article retainer members.
FIG. 3 is an isometric illustration, with parts broken away, of a portion of a third embodiment of the apparatus, the third embodiment incorporating article retainer members of a shape differing from those utilized in the first and second embodiments of the apparatus depicted in FIG. 1.

Turning now to FIG. 2 of the drawing, a portion of a modified embodiment of the apparatus of FIG. 1 is illustrated. The embodiment of FIG. 2 differs from that of FIG. 1 only in the use of spacer members 29 to separate adjacent article retainers 12 along the guide tracks 23 and 24. The spacers, which may include central cut out portions 22 and springs 27 similar to those provided in the article retainers 12, have thicknesses selected in conjunction with the selection of thicknesses of the thickest portions 26 of the article retainers to appropriately space adjacent articles 11 along the guide tracks. The spacers 29 may, of course, be slid onto the guide tracks 23 and 24 between adjacent article retainers 12 during assembly of the apparatus. The embodiments of FIGS. 1 and 2, thus, may be quickly and easily substituted one for the other by introduction or removal of the spacer members 29 between the article retainers 12.

Referring next to FIG. 3 of the drawing, a portion of another modified embodiment of the apparatus of FIG. 1 is shown. The embodiment of FIG. 3 differs from that of FIG. 1 only in the use of article retainer members 12′ shaped differently from the article retainer members 12 illustrated in FIG. 1. Central portions 26′ of the article retainers 12′ depicted in FIG. 3, which may include central cut out portions 22 and springs 27 similar to those provided in the article retainers 12, have hexagonally shaped opposite surfaces 13′ and 14′. The central portions 26′ provide thickest portions of the article retainers 12′ which contact one another along the guide tracks 23 and 24. Non-central portions of the article retainers 12′, located outwardly of the central portions 26′, may be of any desired shape selected, e.g., to conserve material while providing adequate strength and flexibility to the article retainers. The article retainers 12′ perform the same function as, and may be employed in similar manner to, the article retainers 12 as depicted in FIG. 1 and FIG. 2.

It is obvious that many modifications may be made in the illustrative embodiments shown in the drawing. Thus, the article retainers 12 or 12′ may be changed in shape to provide any desired configuration, preferably having a thickest portion along which the article retainers are mounted. The article retainers may have their thickest portions at positions which are not located centrally of the article retainers. Additionally, article retaining means other than the slots 16, e.g., clips or brackets, may be incorporated in the article retainers for retaining the articles 11. Numerous other modifications may be made in accordance with the disclosed principles of the invention.

What is claimed is:

1. In an apparatus for retaining a pair of articles each having a pair of opposite edges:

first and second elongated members spaced from each other and extending in parallel;

a first pair of flexible article retainers each having a thickest portion and mounted on said first elongated member only at said thickest portion for pivotal flexing movement at said thickest portion with respect to said first elongated member and each of said first pair of flexible article retainers including means for retaining a first edge of one of the articles; and a second pair of flexible article retainers each having a thickest portion and mounted on said second elongated member only at said thickest portion for pivotal flexing movement at said thickest portion with respect to said second elongated member and each of said second pair of flexible article retainers including means facing one of the said first article edge retaining means and spaced therefrom for retaining an opposite edge of one of the articles, thereby allowing the pair of articles to be held in a non-uniform angular orientation with respect to each other.

2. In apparatus for retaining a pair of articles each having a pair of opposite edges:

first and second elongated members spaced from each other and extending in parallel;

a first pair of flexible article retainers mounted on the first elongated member and each including means for retaining a first edge of one of the articles;

means positioned between the first elongated member and each of the first pair of article retainers for biasing each first article retainer toward the first edge of a retained article;

a second pair of flexible article retainers mounted on the second elongated member and each including means facing one of the first article edge retaining means and spaced therefrom for retaining an opposite edge of one of the articles, the four article retainers being shaped and mounted on the elongated members for pivotal flexing movement with respect to the elongated members so as to allow non-uniform angular orientation of the retained articles; and means positioned between the second elongated member and each of the second pair of article retainers for biasing each second article retainers toward the opposite edge of a retained article.

3. In an apparatus for mounting a pair of articles each having two opposite edges:

four flexible article retainers each having a thickest portion and each including an article edge retaining portion; and a pair of parallel elongated support members, each of the elongated support members supporting two of the article retainers at said thickest portion with the elongated support members intersecting each article retainer in the direction of thickness of said thickest portion of the article retainer and with their article edge retaining portions facing the article edge retaining portions of the two other article retainers for retaining the pair of articles by their two opposite edges between the facing article edge retaining portions, only one of said support members having its respective article retainers each engaging and supporting one of the pair of articles for pivotal flexing movement about a position of engagement between the article retainers and said one of said support members to retain the articles between facing article retainers at variable angular orientations.

4. In apparatus for mounting a pair of articles at a predetermined spacing between selected portions of the articles while permitting variable angular orientations of the articles:

a pair of parallel elongated members; and four flexible article retaining members each having a thickest portion, the article retaining members being mounted at said thickest portions with two article retaining members carried by each of the elongated members, the article retaining members including means for retaining an article between each pair of opposed article retaining members with the selected portion of the article aligned with said thickest portions of the article retaining members, the elongated members mounting the article retaining members with said thickest portions positioned at intervals selected to provide the predetermined spacing between the selected portions of the articles and with the article retaining members mounted for pivotal flexing movement with respect to the elongated members along said thickest portions.

5. In apparatus as set forth in claim 4:

each article retaining member being mounted and engaged along said thickest portion only, so as to be flexible pivotally about said thickest portion.

6. In apparatus as set forth in claim 4:

at least alternate ones of the article retaining members having surfaces of generally hexagonal shape and having said thickest portions located centrally of the article retaining members.

7. In apparatus as set forth in claim 4:

the elongated members mounting adjacent article retaining members in contact with each other along said thickest portions to space the articles with said selected portions spaced apart by said predetermined spacing.

8. In apparatus as set forth in claim 4:

spacers mounted on the elongated members and separating each adjacent pair of article retaining members at said thickest portions to space the articles with said selected portions spaced apart by said predetermined spacing.

* * * * *